(12) United States Patent
Sumiya et al.

(10) Patent No.: US 8,236,701 B2
(45) Date of Patent: Aug. 7, 2012

(54) PLASMA PROCESSING APPARATUS AND PLASMA PROCESSING METHOD

(75) Inventors: Masahiro Sumiya, Hikari (JP); Motohiro Tanaka, Kudamatsu (JP); Kousa Hirota, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 605 days.

(21) Appl. No.: 12/393,254

(22) Filed: Feb. 26, 2009

(65) Prior Publication Data

US 2010/0197137 A1    Aug. 5, 2010

(30) Foreign Application Priority Data

Jan. 30, 2009  (JP) ................................. 2009-018958

(51) Int. Cl.
*H01L 21/302* (2006.01)

(52) U.S. Cl. ......... 438/719; 438/714; 438/720; 438/723

(58) Field of Classification Search .................. 438/706, 438/710, 712, 714, 720, 723, 719; 216/79, 216/80
See application file for complete search history.

(56) References Cited

U.S. PATENT DOCUMENTS

| | | | | |
|---|---|---|---|---|
| 6,139,702 A | * | 10/2000 | Yang et al. | 204/192.37 |
| 2005/0272227 A1 | * | 12/2005 | Moriya et al. | 438/474 |
| 2007/0262464 A1 | * | 11/2007 | Watkins et al. | 257/774 |
| 2009/0004870 A1 | * | 1/2009 | Liu et al. | 438/710 |

FOREIGN PATENT DOCUMENTS

JP    2004-031308    1/2004

OTHER PUBLICATIONS

Arghavani, R. et al., Semiconductor International, Jan. 2008, pp. 20-27.
Gouil, A. et al., "Chemical analysis of deposits formed on the reactor walls during silicon and metal gate etching processes," Journal of Vacuum Science Technology, vol. B24, No. 5, pp. 2191-2197, Sep./Oct. 2006.

* cited by examiner

*Primary Examiner* — Lan Vinh
(74) *Attorney, Agent, or Firm* — McDermott Will & Emery LLP

(57) ABSTRACT

A plasma processing apparatus includes a processing chamber arranged in a vacuum vessel. A wafer placed on a sample stage in the processing chamber is processed using a plasma formed in the processing chamber. Before etching the film layers provided on the wafer composed of a metal substance and an underlying oxide film or a material having a high dielectric constant, another wafer, provided on a surface thereof a film composed of a metal of the same kind as the metal substance, is processed and particles of the metal are deposited on an inner wall of said processing chamber.

4 Claims, 7 Drawing Sheets

PLASMA PROCESSING APPARATUS AND PLASMA PROCESSING METHOD

INCORPORATION BY REFERENCE

The present application claims priority from Japanese application JP-A-2009-018958 filed on Jan. 30, 2009, the content of which is hereby incorporated by reference into this application.

BACKGROUND OF THE INVENTION

This invention relates to a plasma processing apparatus or a plasma processing method for processing, using a plasma formed in a processing chamber in a vacuum vessel, a plurality of film layers arranged on the surface of a substrate-like sample such as a semiconductor wafer arranged in the processing chamber, or in particular, to a plasma processing method suitable for the surface treatment of a semiconductor substrate or the like using the plasma.

The recent fine patterning of semiconductor devices has come to require a higher dimensional accuracy, i.e. a higher CD (critical dimension) accuracy for the etching process to transfer a mask formed by lithography to an underlying film. In the mass production field, the problem is critical how to secure the CD reproducibility in addition to high CD controllability. Generally, the CD is changed in the etching process by the fact that the reaction products generated from the materials to be processed are deposited on an inner wall of the etching chamber, the fact that the internal members of the chamber are consumed due to a long-term use and the fact that the temperature of the internal members of the chamber is changed, which in turn changes the sticking probability of the radicals to the inner wall of the chamber, resulting in a change in the plasma state having an effect on the etching performance.

In micro transistors, the capacity of a gate insulating film is required to be increased to control the short channel effect, and this problem has conventionally been solved by reducing the thickness of a gate oxide film. A decreased thickness of the gate oxide film, however, increases leak current, and therefore, materials having high dielectric constants (high-k) have been introduced for the gate insulating film. The hafnium oxide film ($HfO_2$) is an example of the high-k material replacing the oxide film. Due to the incompatibility as materials between the polysilicon (poly-Si) electrode and hafnium oxide ($HfO_2$), however, the prior art requires a structure formed of a metal film having a proper work function. Among the various metal materials used for this purpose, TiN or La is a choice as described in Semiconductor International, Vol. 2008/1, pp. 20-27.

In the conventional plasma processing apparatus, cleaning operation is conducted using the plasma for each wafer or lot. For example, plasma containing fluorine (F), chlorine (Cl) or oxygen (O) is used mainly for the cleaning process to remove carbon (C), oxide film, poly-Si and the nitride film. On the other hand, the metal or the like (for example, Al), which is generated by the consumption of the inner wall materials of the etching chamber and may be deposited on the chamber interior, is difficult to remove by the cleaning using the plasma alone. A technique is now under study, therefore, by which seasoning or the like process is executed before etching the product wafer to maintain a constant internal atmosphere of the chamber.

The method described in JP-A-2004-031308 is known as such a conventional technique. According to the disclosure of this conventional technique, the seasoning process is executed to deposit a reaction product containing Si as a component on the inner wall surface of the processing chamber of the vacuum vessel before etching the silicon wafer in the processing chamber using the plasma formed in the particular processing chamber. In etching the polysilicon (poly-Si) film to form the gate of the semiconductor device, for example, a method is disclosed in which the silicon wafer is seasoned by forming a plasma using a HBr, $Cl_2$ or $O_2$ gas or a mixture gas thereof, or the wafer deposited with an Al film is etched with a plasma generated by a mixed gas of $SF_6$ and $Cl_2$ to form an AlF film on the surface of the quartz member in the processing chamber immediately after wet cleaning of the processing chamber.

Also, as described in J. Vac. Sci. Technol. B24, 2191 (2060), a metal material (for example, TiN), if etched, is attached to the inner wall of the chamber and often difficult to completely remove by the cleaning with the plasma using the gas system described above.

SUMMARY OF THE INVENTION

The conventional techniques described above pose a problem as they fail to take the following points into full consideration. Specifically, when etching the film layers formed of a metal material and a material of high dielectric constant, the metal substances contained in these materials may be left in the processing chamber, and this residue is liable to change the performance including the shape and CD value during or as the result of the subsequent process or with an increase in the number of wafers, thereby leading to a lower yield.

The object of this invention is to provide a plasma processing apparatus and a plasma processing method in which the performance variations are suppressed.

In order to achieve the object described above, according to one aspect of the invention, there are provided a plasma processing apparatus and a plasma processing method in which before a wafer, having materials to be processed as a stack layer structure consisting of a film made of a metal and a film made of a high-k material, is processed, a wafer, having the surface thereof consisting of a metal film of the same kind as the metal material contained in the aforementioned layer structure, is processed. In this way, the amount of the metal remaining in the processing chamber is stabilized and the process variation is suppressed. Also, the amount of metal substances remaining in the processing chamber may be monitored and the processing conditions regulated by monitoring the plasma emission.

More specifically, in order to achieve the object described above, according to another aspect of the invention, there is provided a plasma processing apparatus comprising a processing chamber arranged in a vacuum vessel, wherein the wafer placed on a sample stage arranged in the processing chamber is processed using the plasma formed in the processing chamber, and wherein before etching the film layers including a film having a metal substance arranged on the wafer and an underlying oxide film or a material having a high dielectric constant, another wafer with the surface thereof having a film containing a metal of the same kind as the metal substance described above is processed so that particles or a compound of the metal is deposited on the inner wall of the vacuum vessel.

According to still another aspect of the invention, there is provided a plasma processing method for processing the wafer on a sample stage in a processing chamber in a vacuum vessel by forming a plasma in the processing chamber, comprising a step in which before etching the film layers including a film having a metal substance arranged on the wafer and an underlying oxide film or a material having a high dielectric constant, another wafer with the surface thereof having a film containing a metal of the same kind as the metal substance described above is processed so that particles or a compound of the metal is deposited on the inner wall of the vacuum vessel.

Further, the object described above is achieved by controlling the processing of another wafer based on the result of detecting the metal substance using the light emission in the processing chamber.

Further, the object described above is achieved by processing the film layers of another wafer in at least two steps using a gas equivalent to the gas used to etch the film layers of the aforementioned wafer.

Furthermore, the object described above is achieved by setting a time ratio of each step at not more than ±20% of a time ratio for etching the film layers of the aforementioned wafer.

Furthermore, the object described above is achieved by processing another wafer after the wet cleaning of the interior of the processing chamber.

In addition, the object described above is achieved by using at least $BCl_3$ gas to etch the metal substance containing TiN and the $HfO_2$ material having a high dielectric constant.

Other objects, features and advantages of the invention will become apparent from the following description of the embodiments of the invention taken in conjunction with the accompanying drawings.

DETAILED DESCRIPTION OF THE EMBODIMENTS

Embodiments of the invention are explained below with reference to the drawings.

[Embodiments]

Figure 1:
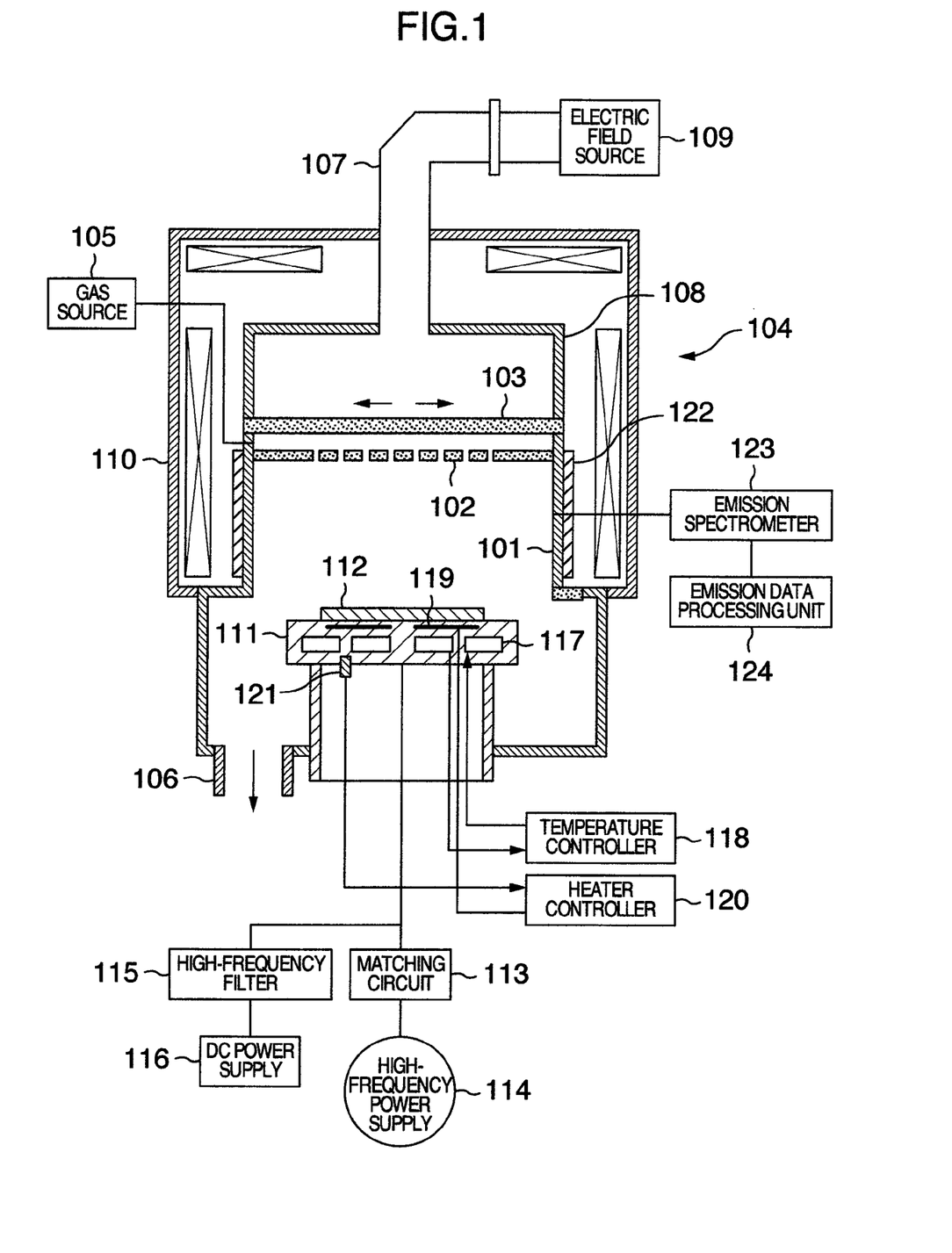
FIG. 1 is a longitudinal sectional view of a microwave ECR etching apparatus according to an embodiment of the invention.

Embodiments of the invention are explained below with reference to FIGS. 1 to 7. FIG. 1 is a longitudinal sectional view schematically showing a configuration of the plasma processing apparatus for processing wafers by forming a plasma using ECR (Electron Cyclotron Resonance) with a microwave according to an embodiment of the invention. FIG. 1 schematically shows a vacuum vessel, a processing chamber arranged in the vacuum vessel, a sample stage arranged in the processing chamber, electrodes, means arranged on the outer periphery and above the vacuum vessel to supply electric and magnetic fields and a power supply for supplying power to these component elements. It is apparent to those skilled in the art that any of these component parts can be deleted or any other equipment or devices can be added in accordance with the required performance or specification to such an extent as not to have an extremely adverse effect on the operation and advantages of the apparatus embodying the invention.

In the plasma processing apparatus shown in FIG. 1, a discal shower plate 102 (formed of, for example, quartz or yttrium having a plurality of through holes at least at the center thereof to pass the gas) and a dielectric window 103 (of quartz, for example) to introduce a etching gas into a cylindrical processing chamber 104 in the vacuum vessel 101 are arranged above the vacuum cylindrical vessel 101 with an open top. The interior and exterior of these component parts are hermetically sealed to form a ceiling and a processing chamber 104. A gas source 105 for supplying the etching gas communicates with the space between the shower plate 102 and the dielectric window 103 thereby to supply the etching gas.

A vacuum exhaust system is connected to the lower part of the vacuum vessel 101 through a vacuum exhaust port 106 facing the bottom surface of the processing chamber 104, so that the interior of the processing chamber 104 can be exhausted and its pressure is reduced (not shown). In order to transmit an electric field into the processing chamber 104 to generate the plasma in the processing chamber 104, a waveguide 107 for propagating the electromagnetic wave (the microwave in this embodiment) is arranged above the dielectric window 103. The lower end portion of the waveguide 107 is coupled to a cylindrical space facing the upper surface of the discal dielectric window 103.

The electric field propagated to the waveguide 107 (or an antenna) is formed by the oscillation of an electric field source 109. The radio wave supplied into the processing chamber 104, though not specifically limited by the operation or advantages of this embodiment, is a microwave having a frequency of 2.45 GHz according to this embodiment. This microwave is generated by the electric field source 109, propagated in the waveguide 107, transmitted from the upper surface of and through the dielectric window 103 and the underlying shower plate 102, and introduced into the processing chamber 104 onto a substantially circular upper surface of an apparently cylindrical wafer mounting electrode 111 constituting a sample stage arranged in the lower part of the processing chamber 104.

A magnetic field generating coil 110 to form a magnetic field in the processing chamber 104 is arranged around and on the upper outer periphery of the processing chamber 104. The electric field generated by the electromagnetic wave source 109 and supplied into the processing chamber 104 interacts with the magnetic field similarly supplied into the processing chamber 104 to excite the processing gas and generate the plasma in the processing chamber 104. As described above, the wafer mounting electrode 111 is arranged in the lower part of the processing chamber 104 in the vacuum vessel 101, facing to the shower plate 102. The upper surface of the wafer mounting electrode 111 is covered with a dielectric film (not shown) formed by spraying a dielectric material, and a conductive film of a metal such as tungsten arranged in the dielectric film is connected to a DC power supply 116 through a high-frequency filter 115.

Further, a discal member formed of a conductive metal such as aluminum or titanium is disposed on the wafer mounting electrode 111, and connected with a high-frequency power supply 114 through a matching circuit 113. Also, a spiral or concentric multiple refrigerant path 117 is disposed in the wafer mounting electrode 111 of a metal material. This refrigerant path 117 is coupled to a refrigerant pipe. The refrigerant pipe is coupled to both a temperature controller 118 and a heater 119, which in turn is connected to a heater controller 120. Also, a temperature sensor 121 is arranged on the wafer mounting electrode 111, and the signal from the temperature sensor 121 is transmitted to the heater controller 120 to control the output of the heater 19 and the temperature setting of the temperature controller 118 for controlling the temperature of the refrigerant in such a manner as to achieve the desired temperature of the wafer 112. With this configuration, the temperature of the refrigerant in the apparatus and hence the wafer mounting electrode 111 are controlled.

An emission spectrometer 123 adapted to measure the light emission in the processing chamber 104 is coupled to the outer wall of the vacuum vessel 101 making up the processing chamber 104. The emission spectrometer 123 is connected to an emission data processing unit 124. The light from the plasma emitted in the process is supplied to the emission spectrometer 123 through a window formed of a material such as quartz formed on the side wall of the vacuum vessel 101. In this way, the emission data is numerically analyzed by the emission data processing unit 124.

The wafer 112 transported into the processing chamber 104 is placed on a dielectric film on the upper surface of the wafer mounting electrode 111 and adsorbed onto the wafer mounting electrode 111 by the electrostatic force generated by the DC voltage applied to the film-like internal electrode from a DC power supply 116. Under this condition, the temperature is adjusted, and a desired etching gas is supplied from a gas source 105 into the processing chamber 104 through the shower plate 102. At the same time, the gas in the processing chamber 104 is discharged from the vacuum exhaust port 106 by the vacuum exhaust unit thereby to control the internal pressure of the vacuum vessel 101 at a desired value. The gas is excited by the electric and magnetic fields supplied into the processing chamber 104, so that the plasma is formed in the processing chamber 104. Once the plasma is formed, a high-frequency power is applied from the high-frequency power supply 114 connected to the wafer mounting electrode 111 and a bias potential is formed on the upper surface of the wafer 112. Thus, ions are attracted onto the upper surface of the wafer 112 from the plasma thereby to start the etching process on the wafer 112.

Figure 2:
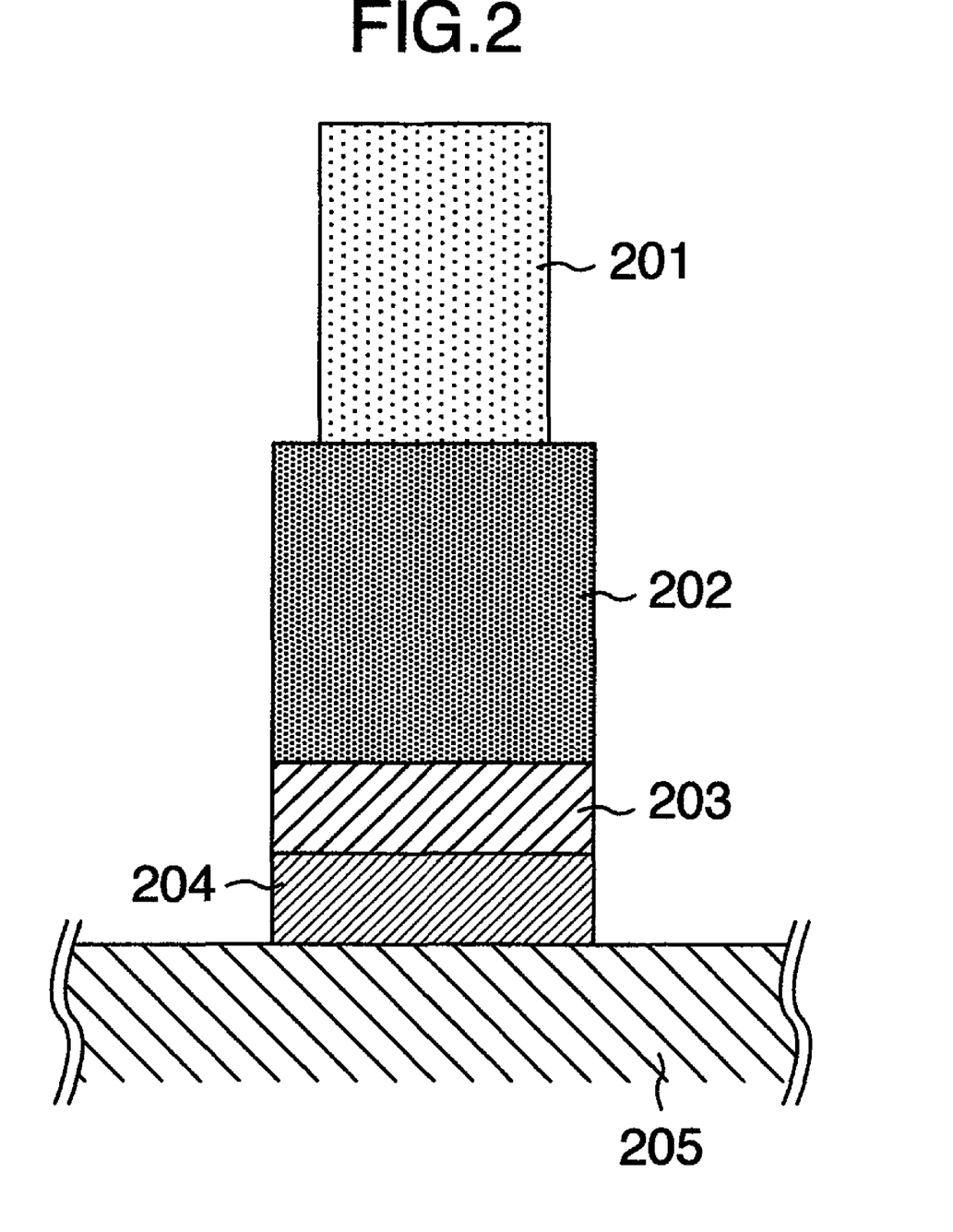
FIG. 2 is a longitudinal sectional view schematically showing the structure of the materials to be processed according to the embodiment shown in FIG. 1.

FIG. 2 schematically shows a structure of materials to be processed in the apparatus according to this embodiment shown in FIG. 1. In FIG. 2, the materials to be processed form film layers stacked on the upper surface of the wafer 112. FIG. 2 schematically shows the shape of a part of the film layers after the process.

The film layers shown in FIG. 2 are formed of multiple or four layers, as an example, stacked on a upper surface of the silicon 205 of the wafer 112 forming the base. These layers form a stack structure including a mask 201 such as a resist (PR) or a hard mask ($SiO_2$, SiN or SiON), an underlying poly-Si (polysilicon) film 202, a film 203 containing a metal material (for example, TiN, hereinafter referred to as a metal film), and a high-k film 204 (for example, $HfO_2$).

This film layer structure, which is to produce the gate structure of the semiconductor device, is formed by a predetermined process before the etching process, and unrequired portion of the mask 201 is removed by lithography. Each of these films shown in FIG. 2, though formed of a single layer, may alternatively be formed of multiple layers. Especially, the metal film 203 may be formed of multiple layers including upper and lower layers of different materials. Also, the kind of the material, the number of layers stacked and the thickness of the metal film 203 are varied in the NMOS and PMOS portions in accordance with the specification of the semiconductor device to be manufactured.

Each film stacked is processed in accordance with a predetermined etching recipe describing the gas composition, the supplied gas amount, the pressure and the processing time at least a part of which is different. Also, the mask 201, simply using the PR in the microprocessing process introduced recently, is insufficient in thickness and etching resistance, and therefore, a hard mask of amorphous carbon (ACL), SiN or SiON and $SiO_2$ may be disposed under the PR, and under and with these layers as a mask, a poly-Si film 202 or a metal film 203 may be further etched thereunder. Here, explanation of the etching process for the mask 201 is omitted.

A mixture gas of $Cl_2$ and fluorine (F)— containing gas ($CF_4$, for example) or a mixture gas of $Cl_2$ and HBr is used as an etching gas for the poly-Si film 202. If required, $O_2$ gas may be also used.

Next, in the first step of etching the metal film 203 (for example, TiN), the wafer bias is increased to a relatively high value and thus the ion energy is increased to remove a naturally oxidized film formed in the boundary of the metal film 203 (the boundary surface formed between the surfaces of the materials of the upper and lower films, which may include a single layer or about several atomic layers of other materials). HBr or Ar, which is generally used as the processing gas in this process, may be replaced with a gas of another system.

After removing the naturally oxidized film, the $Cl_2$ gas or a mixture gas of $Cl_2$ and HBr is mainly supplied as a processing gas to etch the metal film 203. According to this embodiment, the metal film 203, which is small in thickness as compared with other films, is etched by adjusting the wafer bias value via the power from the high-frequency power supply 114 to maintain the ion energy at a comparatively low level.

Next, the $BCl_3$ gas or the mixture gas of $BCl_3$ and $Cl_2$ is used for etching the high-k film (for example, $HfO_2$) formed of a material of a high dielectric constant. In this step, a satisfactory etching characteristic (shape, selectivity) can be achieved by using a relatively low ion energy.

Figure 3:
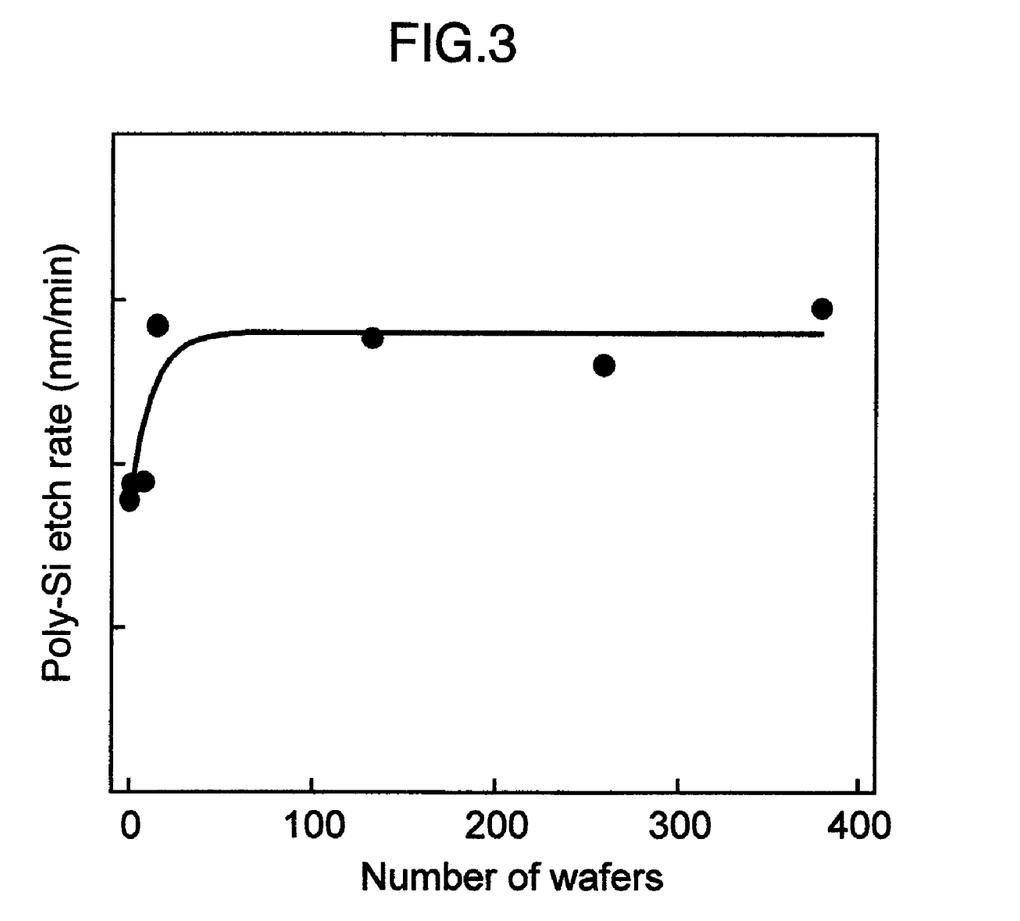
FIG. 3 is a graph showing the result of measured poly-Si etch rate after wet processing in the case of processing the materials to be processed which have a stack structure containing a metal and a high-k material according to the prior art.

In the prior art, once the number of etched wafers reached a predetermined number, the interior of the processing chamber 104 is subjected to cleaning such as wet cleaning, followed by the process of familiarizing the interior of the processing chamber 104 by etching a non-metal wafer such as a Si, PR or oxide film wafer to season the surface of the internal members of the processing chamber 104, only after which the wafers are processed as a product. FIG. 3 is a graph showing the result of measuring the poly-Si etch rate after wet cleaning in the case where a plurality of wafers provided thereon with the materials to be processed having a metal/high-k stack structure were processed according to the prior art.

According to this prior art, the etching rate is changed with the increase in the number of wafers processed. Especially, the etching rate is sharply increased very early in the initial period of the process, after which the etching rate is settled. For this reason, a great shape difference occurs between the product wafer etched immediately after the cleaning and a subsequent product wafer processed after a predetermined number of wafers processed in stable state.

Figure 4:
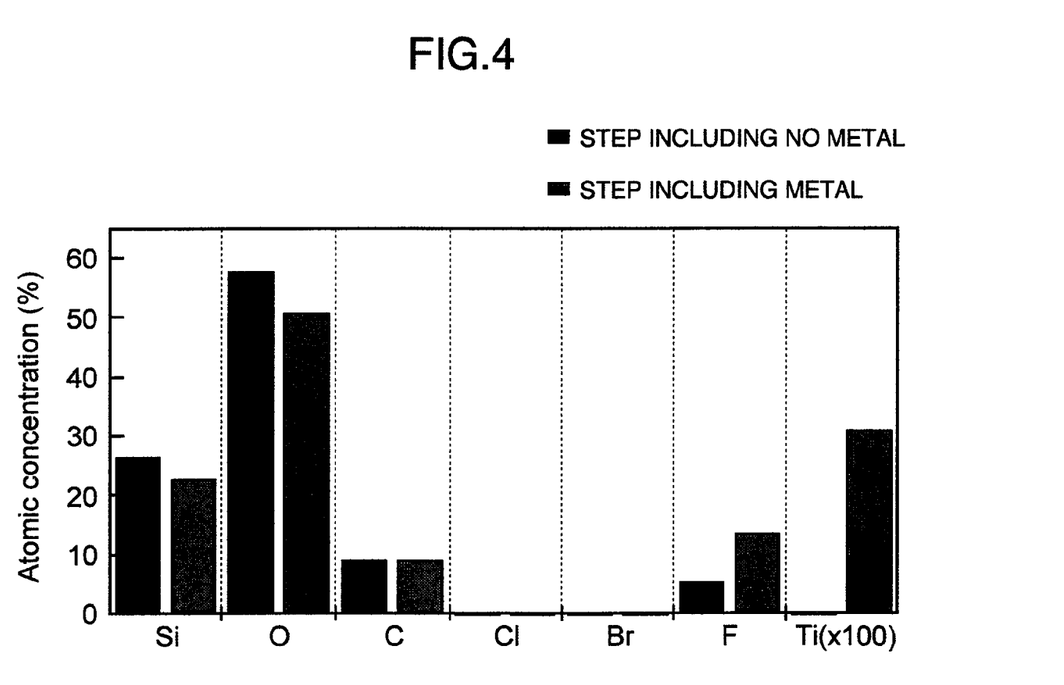
FIG. 4 is a graph showing the result of placing, in the processing chamber, test samples of the same kind of material as the inner wall of the processing chamber and of measuring the surface of each sample using XPS (X-ray photoelectron spectroscopy) in the case where the film layers containing a metal film 203 and the film layers not containing the metal film 203 are processed.

To find the cause of this difference, the present inventors placed two test samples of the same kind of material as the inner wall of the processing chamber, one having layers containing the metal film 203 and the other having the layers not containing the metal film 203, in the processing chamber, processed the respective test samples, and measured the surfaces of the respective samples using XPS (X-ray photoelectron spectroscopy). As a result, as shown in the graph of FIG. 4, Ti was detected from the sample of which the layers containing the metal film 203 were processed. Further, an increased amount of fluorine (F) was detected from the sample of which the layers containing the metal film 203 were processed.

Figure 5:
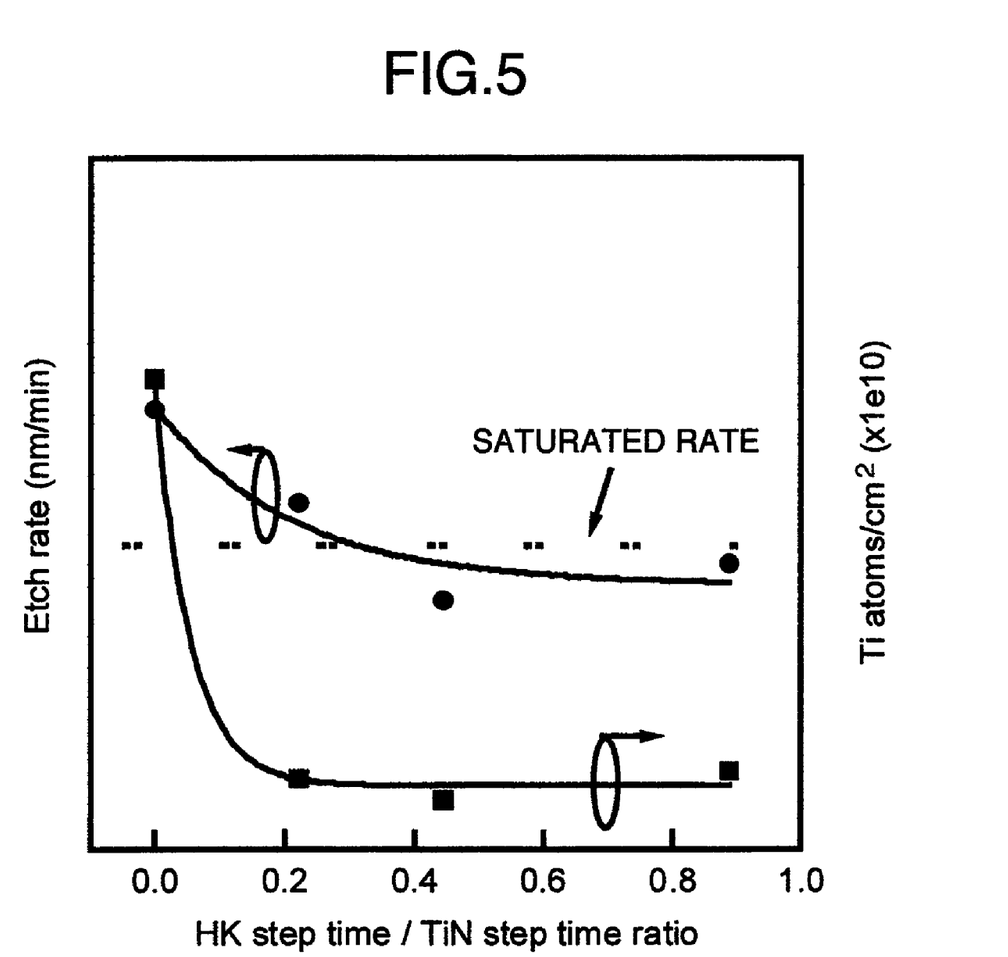
FIG. 5 is a graph showing the result of the measured etching rate of the poly-Si film of another wafer after continuously etching a plurality of wafers, being the etching time of the metal film and the high-k film in the film layers on the wafer of FIG. 2 as a parameter.

FIG. 5 is a graph showing the result of measuring, after etching a plurality of wafers (about ten wafers in the case under consideration) continuously, the etch rate of the poly-Si film 202 of another wafer 112 in the layers shown in FIG. 2, with a ratio of the etching time of the metal film 203 and that of the high-k film 204 as a parameter. In FIG. 5, the dotted line indicates the etch rate of the poly-Si film 202 settled after the wafer 112 is processed for a long time.

As shown in FIG. 5, the shorter the etching time of the high-k film 204, the higher the etching rate, and vice versa. Also, the etching rate is saturated after the lapse of a certain etching time of the high-k film 204. According to this embodiment, TiN is etched as a material of the metal film 203 using the processing gas containing HBr/Cl$_2$. Further, the processing gas containing BCl$_3$/Cl$_2$ is used for etching the high-k film 204. After processing the layers, a Si wafer is placed on the electrode and exposed to the Ar discharge, after which the surface of the Si wafer was measured by TRXF (Total reflection X-ray fluorescence). The amount of Ti detected in each case is plotted along the right axis.

According to this embodiment, the metal material Ti detected is considered to be attributed to the fact that the Ti or the Ti compound left as particles in the processing chamber 104 is scattered and deposited on the wafer 112 by sputtering of Ar. Thus, it is considered to indicate the amount of Ti left in the processing chamber 104. Therefore, the etch rate of the poly-Si film 202 is considered to be correlated with the amount of Ti remaining in the processing chamber 104.

Further, as shown also in FIG. 4, the amount of F is also increased as the result of Ti remaining in the processing chamber 104. To investigate the cause of this phenomenon, detailed examination of the XPS measurement result (not shown) indicates that the peak of Ti—O bond as well as the peak of Ti—F bond is observed at the Ti2p peak and an energy shift toward a low binding energy is seen for the peak of F1s. Therefore, F is considered to be coupled with some metal, and in this case, the present inventors considered that the Ti—F bond exists. This can also explain the phenomenon that the substance making up the inner wall surface of the processing chamber 104 is fluorized by Ti remaining in the processing chamber 104 and F in the plasma is increased, resulting in an increased rate at which the poly-Si film is processed.

Generally, the Ti—F and Ti—O bonds are stable and considered difficult to remove with the cleaning using the plasma as in the prior art. In view of this, according to this embodiment, before processing the materials to be processed to obtain the product wafer 112, the seasoning process is carried out by processing a wafer having on the surface thereof the same substance as the material of the metal (for example, TiN) film 203 contained in the materials to be processed, thereby depositing the same metal substance (for example, Ti) on the interior of the processing chamber 104. As a result, the composition of the gas being processed in the processing chamber 104 can be stabilized. This preliminary cleaning according to the present embodiment is conducted after wet cleaning of the surface of the materials in the processing chamber 104 before processing the product wafer 112.

Figure 6:
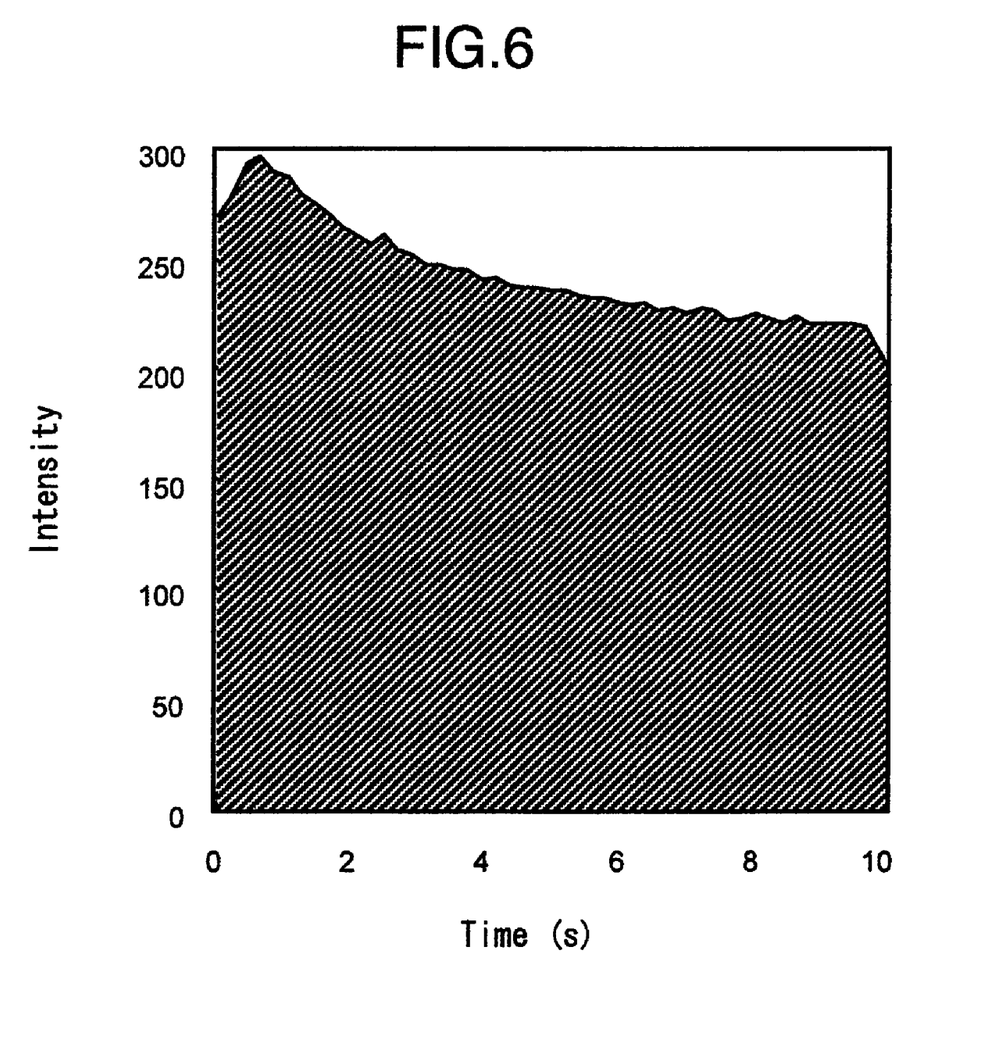
FIG. 6 is a graph showing the change with time of the emission intensity attributable to Ti in the case where the plasma is formed using a processing gas containing $BCl_3$ according to the embodiment shown in FIG. 1.

The seasoning process according to this embodiment may use a plurality of wafers 112 with TiN formed on the surface thereof. In other words, the seasoning process may be conducted repeatedly in advance. In the process, a plurality of wafers having different film layers may be continuously processed. The amount of the metal substance (Ti) remaining in the processing chamber 104 can be detected by generating the plasma on or without the wafer 112 used for seasoning and by using the light emission of the plasma. With reference to FIG. 6, the detection of this metal substance is explained.

FIG. 6 is a graph showing a change in the emission intensity with time attributable to Ti in the case where the plasma is generated using the processing gas containing BCl$_3$ according to the embodiment shown in FIG. 1. According to this embodiment, the emission intensity is analyzed using the light emission data processing unit 124. Especially, the arithmetic unit placed in the light emission data processing unit 124 reads the light emission data which is stored in a storage unit placed in the light emission data processing unit 124 and which is detected during the etching process of the wafer 112 provided with the metal substance on the surface thereof, and performs a specific arithmetic operation including a process of integration of the data on the emitted light of the wavelength corresponding to a predetermined metal substance. In this way, a value indicating the amount of Ti remaining in the processing chamber 104 is calculated and output as a signal thereby to detect the Ti amount.

As described above, with the increase in the amount of Ti deposited on the inner surface of the processing chamber 104 or left in the processing chamber 104 by processing the wafer 112, the rate at which the wafer 112 having the materials to be processed is subsequently etched undergoes a change. Once the amount of Ti exceeds a particular value, the saturated state is reached, in which the processing rate approaches a predetermined value. To determine the Ti amount associated with the saturated state, the data on the light emission from the interior of the processing chamber 104 is firstly acquired and analyzed in the case where the wafer 112 is etched with the surface film containing the metal substance for so long time as to reach the saturated state, and this emission intensity is compared with the emission intensity acquired at the preliminary etching of the wafer with the surface film containing the metal substance (Ti) conducted immediately after the wet cleaning, thereby to detect the end point of the seasoning process conducted until the etching rate is saturated. In place of the gas system containing BCl$_3$ used in this embodiment, the measurement can be conducted using a gas system using a rare gas such as Ar.

Figure 7:
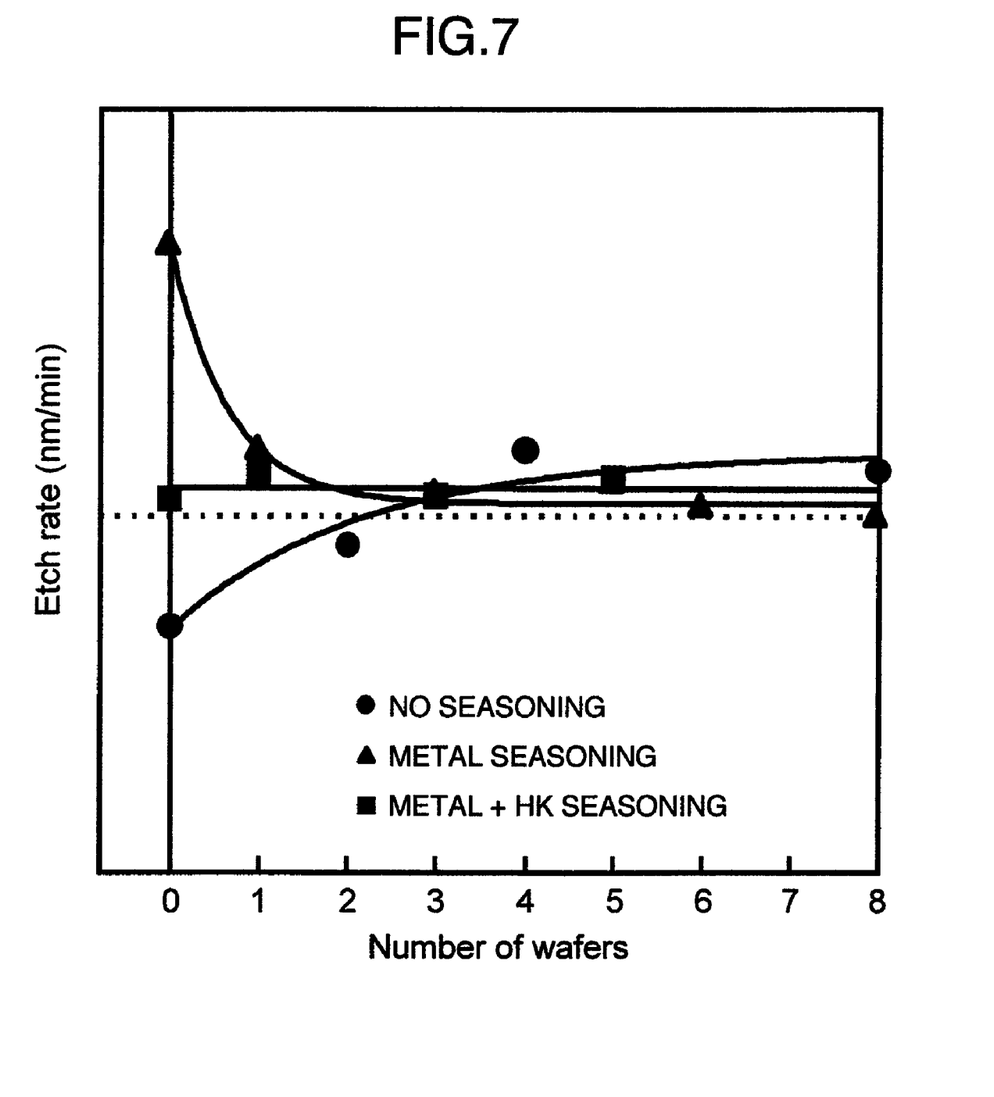
FIG. 7 is a graph showing the change in the etching rates in three cases according to the embodiment shown in FIG. 1, i.e. the case in which the seasoning process is not executed before processing the materials to be processed on the surface of the product wafer 112, the case in which only the process of the TiN etching step is executed, and the case in which the poly-Si film 203 is etched after executing the seasoning process on another wafer having the TiN film and the high-k film, and at the same time, judging the end point of the seasoning with the plasma emission.

FIG. 7 is a graph showing changes in the etching rate in three cases according to the embodiment shown in FIG. 1, i.e.

the case in which the seasoning process is not executed before processing the materials to be processed on the surface of the product wafer 112, the case in which only the process of the TiN etching step is executed using the wafer provided with the TiN film on the surface thereof, and the case in which the poly-Si film 203 is etched after executing the seasoning process in the etching step of the TiN film and the high-k film using a wafer having the TiN film and the high-k film on the surface thereof and judging the end of the seasoning with the plasma emission. In the case where the TiN and high-k process is executed, its rate variation is smallest among the three cases described above and the process is executed in a stable manner. As explained above, the high-k etching step uses the processing gas containing. $BCl_3$ as a component, and in the process using this gas, the Ti remaining in the processing chamber 104 is removed by $BCl_3$.

This indicates that in order to adjust the amount of Ti remaining in the processing chamber 104, it is important to adjust the time ratio between the TiN film etching step and the high-k film etching step or the discharge condition in the preliminary seasoning process, based on the signal obtained from the result of detecting the plasma emission. In this way, the amount of the metal substance (Ti) remaining or deposited in the processing chamber 104 can be controlled to the desired amount by the preliminary seasoning process.

In controlling the amount of Ti left in the processing chamber 104, the process is executed at the time ratio of the etching process of the TiN film/high-k film during the Ti seasoning within 20% or equal to the time ratio between the process of the high-k film 204 and the process of the metal film 203 in the etching of the wafer 112 having the materials to be processed and having the aforementioned film layer structure. In this way, the distribution of Ti remnants accumulated in the processing chamber 104 during the seasoning can be made equivalent to the value for actual processing of the materials to be processed. This is also achieved by making the film configuration on the wafer surface in the preliminary seasoning process equivalent to that of the materials to be processed including the metal film 203 on the one hand, and by making the emission intensity of the metal substance from the plasma in the processing chamber 104 in the TiN/high-k process during the seasoning, equal to the emission intensity of the plasma obtained with the stable processing conditions such as the etching rate, especially at the time of processing the product wafer 112 having the materials to be processed on the other hand. Furthermore, a similar purpose can be attained by setting the condition of the process including the composition of the processing gas used for the film processing in the preliminary seasoning process, equal or substantially equal to the condition for the process of the wafer 112 having the materials to be processed.

The preliminary seasoning process described above is configured of two or more steps. By executing this process, the amount or the distribution of Ti remaining in the processing chamber 104 can be controlled with high accuracy for an improved process stability.

As described above, according to this embodiment, before processing the materials to be processed having the stack structure of the metal film 203 and the high-k film 204, another wafer, having on the surface thereof a film containing the metal substance of the same kind as the material of the metal film 203 contained in the materials to processed is processed, and the film is etched. Further, the amount of the metal substance remaining in the processing chamber 104 is detected by monitoring the light emission in the processing chamber, or by adjusting the processing condition by use of the detection result, the residual amount of the metal substance in the processing chamber 104 is stabilized and the resulting change in shape obtained by processing can suppressed. In this way, the stability of the CD value after the process can be improved. Thus, the apparatus or the method for the etching process suppressing the process yield reduction and having a smaller secular variation can be provided.

Also, since the amount of the metal substance remaining in the processing chamber 104 is stabilized, the process variation which otherwise might be caused by the metal substance is suppressed, thereby making it possible to suppress the CD variation.

According to the embodiments described above, the ECR plasma equipment is described especially. Nevertheless, this invention is applicable with equal effect by using other plasma generating apparatuses or methods such as the inductively-coupled plasma (ICP) or the capacitance-coupled plasma (CCP).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for plasma etching a first wafer by a plasma formed in a processing chamber, the first wafer being provided with a film including a metal substance, a polysilicon film disposed over the film including the metal substance, and an oxide film beneath the film including the metal substance or a film including a high dielectric constant material beneath the film including the metal substance, the method comprising steps of plasma processing a second wafer to provide a film on a surface thereof, the film including a metal of the same kind as the metal substance; and after plasma processing the second wafer, etching the polysilicon film of the first wafer.

2. The plasma processing method according to claim 1, wherein said plasm processing of said second wafer is adjusted such that, by detecting an amount of the metal substance deposited in said processing chamber using a light emission in said processing chamber, the detected amount of said metal substance reaches an amount necessary to stabilize an etching rate of said polysilicon film of the first wafer.

3. The plasma processing method according to claim 2, wherein said processing of said second wafer comprises:

plasma processing by using a gas equivalent to a gas used for etching said film including the metal substance; and plasma processing by using a gas equivalent to a gas used for etching said film including the high dielectric constant material.

4. The plasma processing method according to claim 1, wherein:

said film including said metal substance includes TiN, said material having a high dielectric constant is $HfO_2$, and the $HfO_2$, is etched using $BCl_3$ gas.

* * * * *